United States Patent [19]

Comerford

[11] Patent Number: 4,592,057
[45] Date of Patent: May 27, 1986

[54] VERSATILE DIGITAL CONTROLLER FOR LIGHT EMITTING SEMICONDUCTOR DEVICES

[75] Inventor: Liam D. Comerford, Carmel, N.Y.

[73] Assignee: International Business Machines Corporation, Armonk, N.Y.

[21] Appl. No.: 362,936

[22] Filed: Mar. 29, 1982

Related U.S. Application Data

[63] Continuation-in-part of Ser. No. 246,804, Mar. 23, 1981.

[51] Int. Cl.[4] .................................................. H01S 3/30
[52] U.S. Cl. ..................................... 372/8; 372/31; 372/38; 372/26; 250/205; 455/618; 455/611
[58] Field of Search .................. 372/46, 50, 38, 8, 29, 372/31, 26; 357/17, 19; 340/347 M; 330/4.5; 455/618, 613, 610, 611, 608, 253

[56] References Cited

U.S. PATENT DOCUMENTS

| | | | |
|---|---|---|---|
| 3,858,056 | 12/1974 | Melamed et al. | 372/31 |
| 4,009,385 | 2/1977 | Sell | 455/611 |
| 4,149,071 | 4/1979 | Nagai et al. | 455/613 |
| 4,158,132 | 6/1979 | O'Dell | 250/205 |
| 4,176,401 | 11/1979 | Lonberger | 455/613 |
| 4,352,013 | 9/1982 | Fasig et al. | 250/205 |
| 4,359,773 | 11/1982 | Swartz | 372/29 |
| 4,369,525 | 1/1983 | Breton et al. | 372/31 |
| 4,443,695 | 4/1984 | Kitamura | 250/205 |

OTHER PUBLICATIONS

Hnatek, "A User's Handbook of D/A and A/P Converters", John Wiley & Sons, ISBN-0-471-40109-9, pp. 88 and 89.

*Primary Examiner*—William L. Sikes
*Assistant Examiner*—Léon Scott, Jr.
*Attorney, Agent, or Firm*—Ronald L. Drumheller

[57] ABSTRACT

Drive current for a light emitting semiconductor device, such as an injection laser, is supplied by a digitally programmable current source capable of supplying any one of a plurality of different discrete current amplitudes. Light emitted by the device is sensed and an amplitude parameter (e.g. instantaneous current or power amplitude, average current or power amplitude, modulation amplitude, etc.) is digitally encoded. A logic circuit responsive to the digitally encoded amplitude parameter and optionally responsive to other digital signals as well, controls the discrete current amplitude supplied by the programmable current source.

17 Claims, 5 Drawing Figures

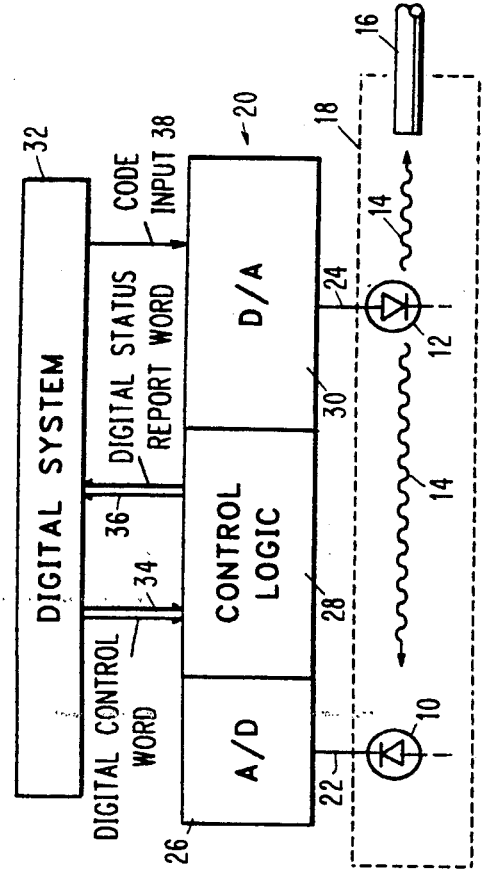
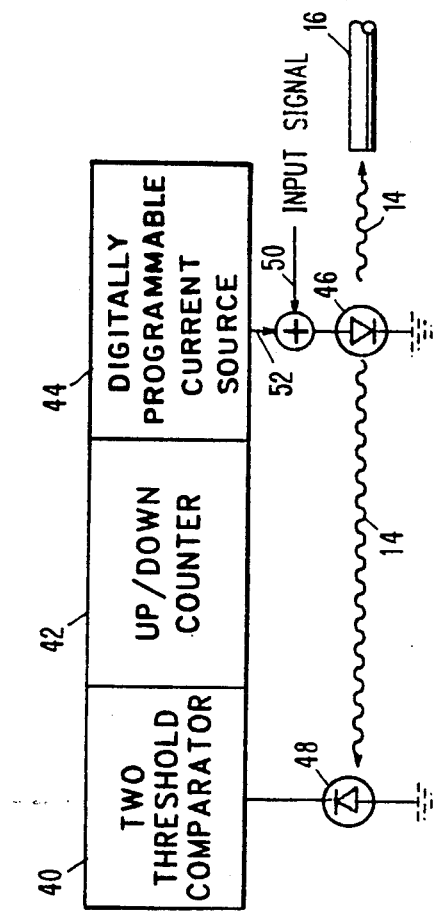
FIG.1
FIG.2

VERSATILE DIGITAL CONTROLLER FOR LIGHT EMITTING SEMICONDUCTOR DEVICES

This is a continuation-in-part of application Ser. No. 246,804, filed Mar. 23, 1981.

TECHNICAL FIELD

This invention generally relates to control of the drive current for a light emitting semiconductor device and more particularly it relates to feedback control of bias current and/or modulation amplitude for an injection laser.

BACKGROUND ART

An injection laser is a semiconductor device which normally acts as an efficient and compact source of coherent light. Use is being made of such devices in data communications and in recording, printing and displaying apparatus.

In order to be operated satisfactorily in most applications, it is necessary that an injection laser be supplied with a bias current. Examples of use of a fixed value bias current for an injection laser may be found, for example, in U.S. Pat. Nos. 3,319,080, 3,815,045, 3,925,735, 3,968,399, and 4,027,179.

Feedback control of laser bias current is also known. If the bias current is controlled by a negative feedback system responsive to the light output, then there is compensation for differences in individual device characteristics and for time varying changes in device characteristics due, for example, to aging or temperature changes.

Examples of the use of feedback control of bias current for an injection laser may be found in U.S. Pat. Nos. 3,946,335 and 4,009,385 and in the following technical articles: J. Gruber et al, "Electronic Circuits for High Bit Rate Digital Fiber Optic Communications Systems", COM-26 IEEE Trans. Comm. 1088-1098 (July 1978); D. Smith, "Laser Level-control Circuit for High-bit-rate Systems Using a Slope Detector", 14 Elect. Lett. 775-6 (1978); P. Schumate et al, "GaAlAs Laser Transmitter for Lightwave Transmission Systems", 57 Bell Sys. Tech. Jour. 1823-1836 (1978).

All of these feedback systems are of the analog type, even when the injection laser modulation signal is digital in nature. This is apparent because there is no conversion of the sensed light amplitude into a digital code, and the bias current (as opposed to the modulation signal) for the injection laser is not produced by converting a digital representation into analog form. That the bias current is analog in character is also apparent from the continuous nature of the amplitude value it can assume. If the bias current were produced as a result of conversion from a digital code, the bias current could assume only discrete values in the steady state (after transients due to a change from one discrete value to another have disappeared). Thus, the prior art has used analog feedback to control the bias level of an injection laser even though the signals superimposed on the controlled bias level usually are digital in nature.

The prior art circuits are inherently difficult to monolithically integrate, since they include circuit elements such as capacitors and inductors which are inherently difficult to integrate.

These circuit elements are needed in such analog circuits because of the need to have one or more low pass networks. Such networks are used, for example, to prevent the modulation signal from adversely affecting the negative feedback bias stabilization system and in the feedback system itself to perform operations such as mathematical integration. These prior art circuits also provide no extended or flexible set of control or test functions since each additional function requires additional circuitry. As a result, the prior art control circuits lack versatility. Different modes of operation and/or different applications usually require a different control circuit.

Monolithic integration offers cost and performance advantages over other methods of implementation. It also makes the size of the control system sufficiently small that it can be placed in the same module as the injection laser and associated output optical fiber. An extended set of control and test functions, furthermore, offers the flexibility in application which is generally associated with digital circuit elements.

It is an object of this invention to provide a bias current control circuit for an injection laser which can be readily integrated monolithically.

A further object is to provide a control circuit for an injection laser which has an extended and flexible set of control, modulation, and test functions.

Another object is to provide an injection laser control circuit which can be manufactured and tested on a conventional manufacturing line for digital components.

Still another object is to provide an injection laser control circuit in a size sufficiently small that it can be packaged in the same module as the injection laser and associated output optical fiber.

It is also an object to provide a digital control circuit for an injection laser.

DISCLOSURE OF INVENTION

Drive current for a light emitting semiconductor device, such as an injection laser, is supplied by a digitally programmable current source capable of supplying any one of a plurality of different discrete current amplitudes. Light emitted by the device is sensed and an amplitude parameter (e.g. instantaneous current or power amplitude, average current or power amplitude, modulation amplitude, etc.) is digitally encoded. A logic circuit responsive to the digitally encoded amplitude parameter, and optionally responsive to other digital signals as well, controls the discrete current amplitude supplied by the programmable current source.

When the preferred embodiment is used for digital (or analog) communications, for example, the digitally programmable current source may supply bias current for the injection laser. Modulation current may be added to this bias current to form the total drive current for the laser. In another embodiment, the modulation current is supplied by the programmable current source and bias current is added to this modulation current to form the total drive current for the laser. In still another embodiment one digitally programmable current source supplies the bias current while a separate digitally programmable current source supplies the modulation current.

BRIEF DESCRIPTION OF THE DRAWINGS

FIG. 1 is a general block diagram of a digital controller for drive current of a light emitting semiconductor device in accordance with this invention.

FIG. 2 is a block diagram of an embodiment of the digital controller.

BEST MODE FOR CARRYING OUT THE INVENTION

Figure 3:
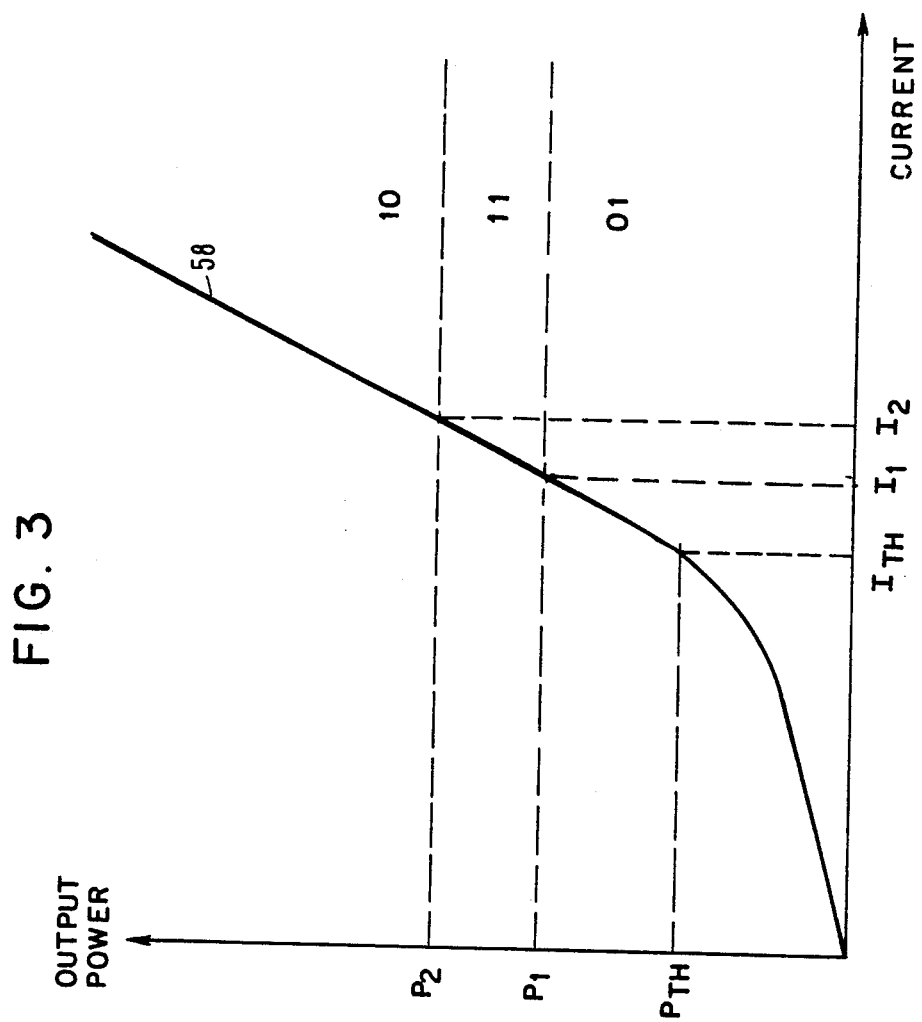
FIG. 3 is a graphical representation of the output power curve of a typical injection laser as a function of drive current with three digitally encoded regions defined.

A light sensitive device 10 is positioned with respect to a light emitting semiconductor device 12 such that it responds to light 14 emitted by device 12. Light 14 from device 12 also travels in other directions, where it performs one or more useful functions. For example, the light 14 may be coupled into an optical fiber 16 as shown in FIGS. 1 and 2. The light going to the light sensitive device 10 also may be derived from the optical fiber 16 or another optical path. Devices 10 and 12 may be mounted on a common structure 18 in any convenient fashion. Digital controller 20 responds to an analog signal on line 22 coming from device 10 and generates a drive current in line 24 for device 12. Digital controller 20 generally comprises an analog to digital converter 26, control logic 28 (which may be a microprocessor), and a digital to analog converter 30. Controller 20 is generally adapted for digital intercommunication with another digital device represented in FIG. 1 by digital system 32. Digital system 32 communicates control information to controller 20 via digital control word line 34. Controller 20 reports status information to digital system 32 via digital status report word line 36. In most applications, light emitting device 12 is modulated in some fashion. The modulation information is generally communicated to controller 20 from digital system 32 via a code input line 38. As will become apparent, the modulation information can be communicated to controller 20 as well from some device other than system 32; it may be summed with the controlled output 24 rather than used to control the output; and it may be analog in nature rather than digital.

Although device 12 can be virtually any light emitting semiconductor device, such as an injection laser or light emitting diode (LED), the digital controller has particular features which are best used to advantage when the device is an injection laser. Accordingly, the controller implementations which will be described in detail will be controllers for an injection laser. It should be understood that with only minor changes which will be apparent to one of ordinary skill, the same controllers could be used with other light emitting devices.

FIG. 2 illustrates an embodiment for the controller in which laser bias current is being controlled. The analog to digital converter is implemented as a two threshold comparator 40; the control logic is implemented as an up/down counter 42; and the digital to analog converter is implemented as a digitally programmable current source 44. As will become apparent, this controller has several different modes of operation and many different applications in which it can be used. In the embodiment shown in FIG. 2, the light emitting device is an injection laser 46 and the light sensitive device is a photodiode 48. In the application illustrated, the laser 46 is being used to transmit optical signals into an optical fiber 16. The input signal on line 50 may be either a two or more level digital signal or it may be analog. The optical signal generated by laser 46 will correspond in character with the input signal. For simplicity in description, the input signal is shown to be added to an output signal 52 from the digitally programmable current source 44. It should be understood that the two signals alternatively could be summed inside of current source 44. Also, the programmable current source instead could receive a coded input signal and decode and/or convert it into a component of the output signal 52.

FIG. 3 is a graphical representation of the output power curve of a typical injection laser. When the drive current exceeds a threshold value $I_{TH}$, the device begins to lase. Following $I_{TH}$, there is an approximately linear region 58 where the device is fully lasing. The slope of region 58 is much steeper than that below $I_{TH}$. Superimposed on the optical power output curve is a definition of three regions. The laser will be controlled so that the average output power will stay within the region labeled with the binary code "11". Accordingly, region "11" is suitably spaced above $P_{TH}$ so that expected variations in the output power will not cross $P_{TH}$. On the other hand, the region "11" is not so far up the curve that the laser lifetime is unduly shortened thereby. Region "01" is defined as the power region below the "11" region, and region "10" is defined as the power region above the "11" region.

The two threshold comparator 40 determines whether the laser is operating in region "11" or in region "10" or in region "01". $P_1$ is the lower of the two thresholds and defines a corresponding drive current of $I_1$. The other threshold is defined by $P_2$, which defines a corresponding drive current $I_2$. $I_1$ and $I_2$ are determined in part by the optical power output curve, which changes with temperature and age and varies from device to device. Region "11" is defined as the power region between the two thresholds. Up/down counter 42 responds to the comparator 40 determination. When the laser is in region "11", the counter 42 holds the present count. When the laser is in region "01", counter 42 changes the count gradually in a direction such that laser power will tend to be increased thereby. When the laser is in region "10", counter 42 changes the count gradually in the opposite direction such that laser power will tend to be decreased thereby. The count of counter 42 is converted to a corresponding bias current for the laser by the digitally programmable current source 44.

Figure 4:
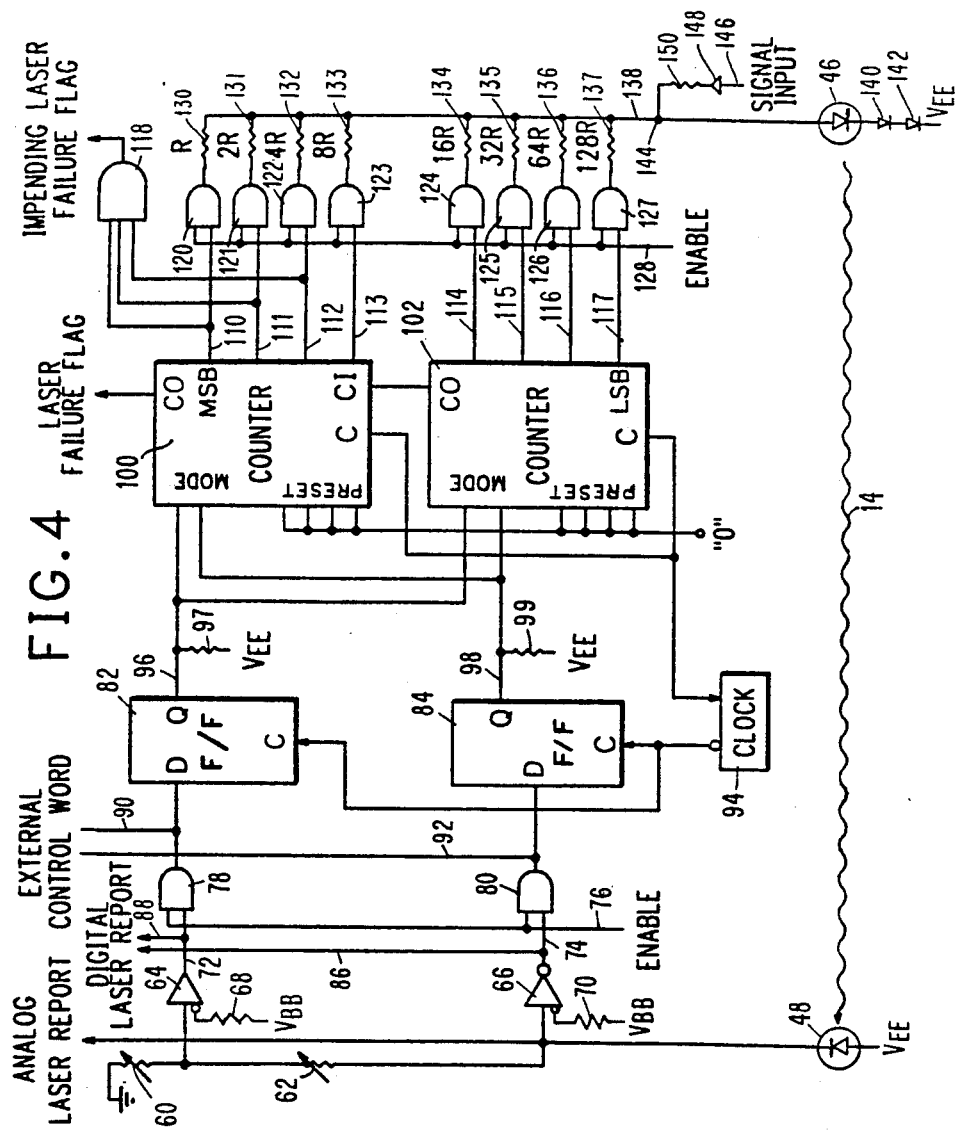
FIG. 4 is a schematical representation of the embodiment shown also in FIG. 2.

FIG. 4 is a more detailed schematical representation of the embodiment generally shown in FIG. 2. The logic topology illustrated in FIG. 4 has been designed to generate the codes illustrated in FIG. 3. Other topologies can be used to generate the same codes. The codes in FIG. 3 are those used in a commercially available logic chip used to implement part of this circuit. Other chips requiring other codes may be used in which case the topology of the logic must be modified accordingly. FIG. 4 also assumes an Emitter Coupled Logic implementation. Other logic technologies can be used and would result in obvious modifications. Photodiode 48 is positioned with respect to laser 46 such that it is illuminated by some of the light 14 emitted by laser 46. This light causes a photocurrent proportional to the light intensity to flow in the photodiode load circuit, which comprises a series connection of resistors 60, 62. The magnitude of this current is digitally encoded by resistors 60, 62 acting together with a first comparator 64 and a second comparator 66.

By proper selection of inverted and not-inverted inputs and outputs for comparators 64, 66 as well as by proper selection of the values for resistors 60, 62, 68 and 70, the logic code at the outputs 72, 74 of comparators 64, 66 is made to correspond with the code selections illustrated in FIG. 3. Thus, when the laser output power is less than $P_1$, the photocurrent flowing in the load circuit of photodiode 48 is such that the logic value at points 74, 72 is "01". When the laser output power is between $P_1$ and $P_2$, the logic value at points 74, 72 is "11". When the laser output power is above $P_2$, the logic value at points 74, 72 is "10".

A logic value of "0" on enable line 76 forces the output of the AND gates 78, 80 to "0" thus opening the feedback loop by preventing the logic value at points 72, 74 from being applied to the inputs of flip-flops 82, 84. The logic value at points 72, 74 is still available to an external system (such as digital system 32 or a microprocessor) via lines 86, 88. An externally generated logic value can be applied to the flip-flops in place of the logic value at points 72, 74 by applying such logic value to the inputs of flip-flops 82, 84 via lines 90, 92. When the logic value of enable line 76 is "1", AND gates 78, 80 apply the logic value at points 72, 74 to the inputs of flip-flops 82, 84. This is a conventional method for gating logic signals. It may be performed with other logic gates.

Assuming that enable line 76 is "1", the next rising edge of a clock pulse from clock 94 to the clock inputs of flip-flops 82, 84 causes the logic value at points 72, 74 to be loaded into flip-flops 82, 84. This causes the outputs 96, 98 of flip-flops 82, 84 to have the same logic value as points 72, 74.

Up/down counter 42 (FIG. 2) is implemented by connecting two hexadecimal counters 100, 102 in cascade. Counters 100, 102 each provide a 4 bit parallel output. The overflow "Carry Out" terminal 104 of counter 102 is connected to the "Carry In" terminal 106 of counter 100. The two counters 100, 102 thus function as a single counter which has an 8 binary bit counting range and an 8 bit parallel output. More such counters can be cascaded in the same fashion to achieve any desired number of output bits with corresponding improvements in the resolution of the control system output.

Counters 100, 102 each have the following logic code governing operation. When the mode input is "11", the counters hold the count without change. When the mode input is "01", the counters increment by one count when a rising edge of a clock pulse from Clock 94 is received at the clock input (C). When the mode input is "10", the counters decrement by one count when a rising edge of a clock pulse is received at the clock input (C). When the mode input is "00", the counter loads the count represented on the preset terminals (PRESET) All of the preset terminals are connected to a logic level "0" potential as shown. A code of "00" occurs at points 96, 98 automatically upon initial turn on due to the presence of pull-up resistors 97, 99. Therefore, counters 100, 102 always start at a "00000000" count upon turn on. This protects the laser 46 from a possibly damaging transient at turn on.

Overflow of counter 100, indicated by the presence of a "1" at the carry out (CO) terminal, indicates that a light output within the "11" power range cannot be achieved by the feedback controller. This generally means that the laser 46 has failed. Therefore, an overflow count from counter 100 on line 104 is interpreted as a "Laser Failure Flag". A logic value of "1" simultaneously on all three of the most significant output bit lines 110, 111, 112 is interpreted as an impending failure of the laser as this indicates that ⅞ of the controller range has been utilized. This condition is detected by AND gate 118, a "1" output on which is interpreted as an "Impending Laser Failure Flag".

The output bit lines 110–117 of counters 100, 102 are each connected to an AND gate 120–127. The other input of each of these AND gates is connected to an Enable line 128. When AND gates 120–127 are enabled by a "1" on Enable line 128, the count on counters 100, 102 is transferred through the AND gates and is applied to a binary resistor ladder comprising resistors 130–137. The values of the resistors increase in value in binary fashion as indicated so that the sum of all the currents going through the resistors in the binary ladder is a discrete value corresponding to the count.

The binary ladder acts as a digital to analog converter or a digitally programmable current source. The sum of all the currents going through the binary ladder resistors is applied as a drive current to laser 46 via line 138. Other D/A resistor networks such as an R2R network may be used.

As is well known to those of ordinary skill in this art, pull down resistors must be used with ECL technology. Most of the pull down resistors have not been shown in order to simplify the schematic representation. One result of using ECL technology is that currents never go all the way to a zero value. Accordingly, some current flows in line 138 even when the count is "00000000". The D/A resistor network should be designed so that this current is not sufficient for laser 46 to reach threshold.

Diodes 140, 142 are provided to offset the logic supply voltage ($V_{EE} = -5.2$ volts) so that the additional voltage drop across the laser diode 46 will provide the correct terminating voltage ($V_{TT} = -2$ volts) to the resistors in the D/A network.

When the digital controller illustrated in FIGS. 2–4 is used in an optical communications application, the sequence of internal operations of the controller is as follows: When power is turned on, the counter loads the preset zeros. Immediately thereafter the A/D converter encodes the laser output power as insufficient ("01"). This causes the counter to count up, thereby increasing at each count the bias current supplied to the laser by the D/A converter via line 38. This continues until the laser output power falls within the acceptable power range ("11") and is so encoded. A modulation signal may now be added to the bias current at node 144. A signal input on line 146 applies modulation current to this node via gate 148 and resistor 150. The modulation current will change the average power produced by the laser. If the excursion in the average power is sufficient to force it outside of the acceptable power range ("11"), then this will be encoded by the A/D converter and the counter will increment or decrement to compensate. In practice, the acceptable power range ("11") is selected so that its width is slightly greater than the average power variation which the input modulation signal will produce. The resolution of the programmable current source (D/A converter) is sufficiently great that at least one counter state exists such that the average power variations introduced by the modulating current will not cause changes in the counter state. After a brief period of operation, the counter is forced to this state (or one of these states). Once this status is achieved, the only phenomena which will cause the counter to change state are changes in the laser's average power caused by age or temperature.

When the controller is used instead in a peak power control modulation mode as may be needed in printing, recording or display applications, the sequence of internal operations of the controller is as follows: Logic level zero signals are supplied to the enable line 76 and the external control word lines 90, 92. Power is then applied to the controller and the counter loads the preset zeros. The sequence of digital signals which are to be represented as peak power controlled optical pulses is now applied to the enable line 76. As soon as the first logic level one is applied to this line, the control loop will be closed, the state of the laser will be encoded, and the counter will increment until the acceptable power range ("11") has been reached by the laser output. The acceptable power range will have been set to that required by the application by appropriately setting resistors 60, 62. The controller maintains the laser output power in the acceptable power range by the mechanism described earlier as long as the external control word enable 76 is kept at logic level one. When enable 76 is returned to logic level zero, the zero preset is again loaded into the counter causing the laser output to fall to zero. This cycle is repeated every time a pulse is applied to enable line 76. Enable 128 may also be used to achieve similar modulation of the laser drive current by setting the External Control word lines to "11" and the enable line 76 to zero after the laser is in the acceptable range. It will be necessary in this mode of operation to periodically re-enable the feedback loop in order to update the counter.

Enable line 76 and the external control word lines 90, 92 may be forced to logic level zero in order to turn the laser off. This signal may be supplied by an interlock switch on the cabinet in which the laser is mounted or by a signal from the system in which the laser is used. This feature provides means by which personnel may be protected from inadvertent exposure to the laser radiation. Enable line 128 may be used instead to accomplish the same function.

The controller can test the condition of the laser diode to which it is connected by supplying a logic level zero to enable line 76 and external control word line 92 and a logic level one to external control word line 90. This will cause the counter to count up continuously. The D/A converter will thus be ramped repetitively through its dynamic range. The current through the laser diode will thus range from some value below threshold to the peak current that the D/A converter can supply. The response of the laser diode to all currents in this range may then be examined either at the Analog Laser Report line or at a laser optical output port.

In the above described peak power controlled modulation mode, the laser is caused to have an output which switches between two power levels, one of which is the zero power level (i.e., turned "off") and the other of which is a power level determined by the controller. In the peak power controlled modulation mode of operation there is no controlled bias current. The controller instead controls another laser operational parameter, namely the "on" state power level. In general, the digital controller can be used to control any operational parameter of the laser which can be sensed directly or derived from directly sensed parameters and which can then be controlled in response thereto.

Figure 5:
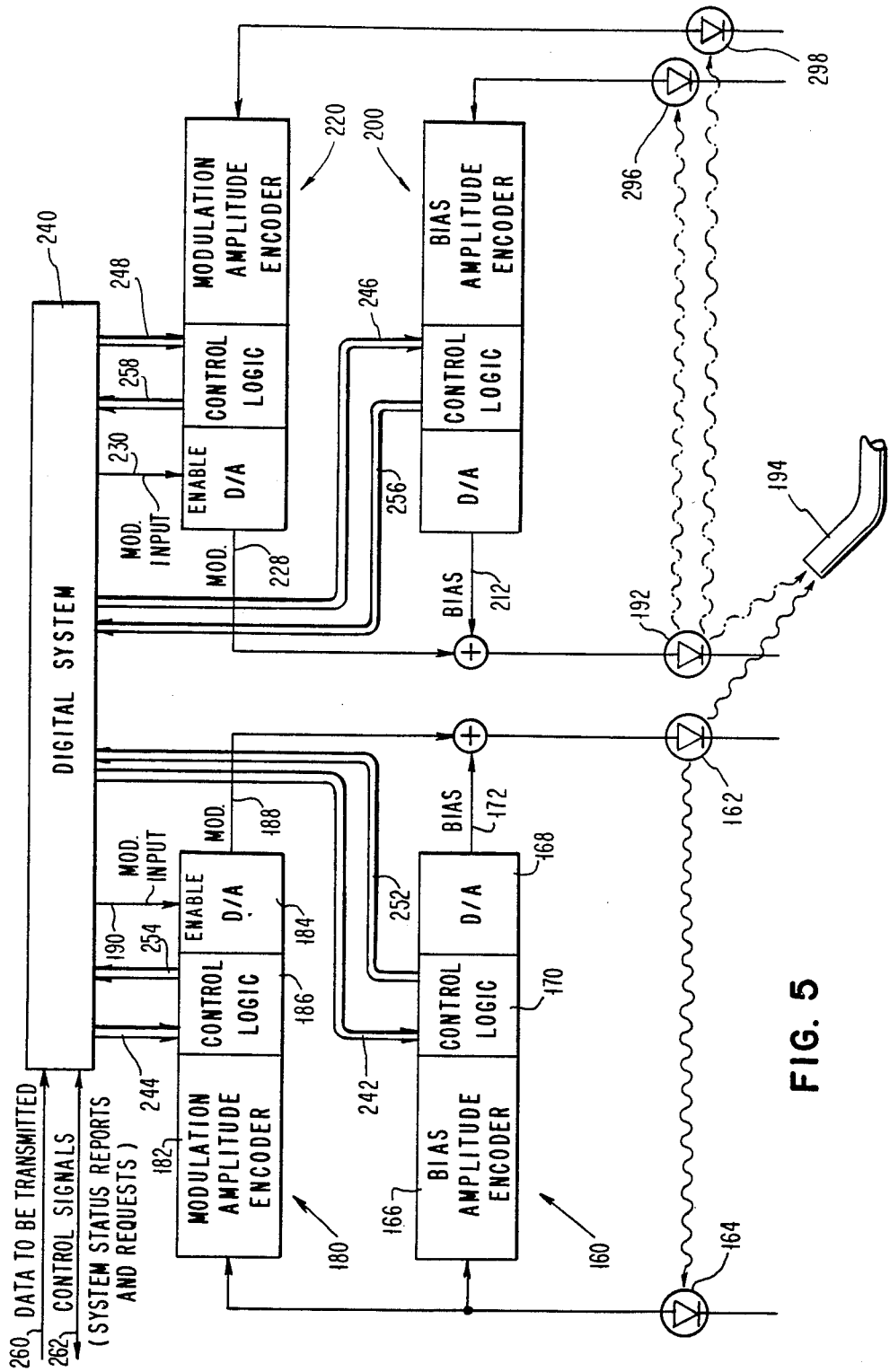
FIG. 5 is a block diagram of another embodiment of the digital controller.

It is also possible to control more than one laser operational parameter simultaneously, e.g. through simultaneous use of more than one controller. For example, both of the power levels between which the laser is caused to switch may be controlled directly by separate controllers. An indirect way of controlling both power levels also may be used. For example, one digital controller might hold the average bias level of the laser within a predetermined range while another digital controller maintains the modulation amplitude within a predetermined range. This embodiment is shown in FIG. 5, which also illustrates a redundant system design using a redundant laser and digital controllers.

Digital controller 160 corresponds in function to the controller illustrated in FIGS. 2-4. The bias amplitude of laser 162 is derived from the light amplitude sensed by photodiode 164. In FIG. 5, the function of deriving and digitally encoding the bias amplitude is represented by functional block 166. A direct method of deriving a bias amplitude, for example, might be to measure an detect or calculate an average light amplitude over very many modulation cycles. Digital to analog converter 168 responds to the digitally encoded bias amplitude via control logic 170 and provides a bias current 172 for laser 162.

A separate digital controller 180 controls the modulation amplitude of laser 162. The modulation amplitude of laser 162 also is derived from the light amplitude sensed by photodiode 164 and is digitally encoded by modulation amplitude encoder 182. Obviously, controllers 160, 180 alternatively could be supplied input signals from separate photosensors, rather than the common photosensor as shown. Modulation amplitude encoder 182 detects, measures or calculates the difference between the two different light amplitudes characterizing the modulation. Digital to analog converter 184 responds to the digitally encoded modulation amplitude via control logic 186 and provides a modulation current level on line 188 whenever so enabled by the modulation input 190. That is, when the modulation input 190 has one of two different levels, the output of D/A 184 is disabled and consequently equal to zero. When the modulation input 190 has the other one of two different levels, the output of D/A 184 is enabled and has a controlled level.

In practice, controller 180 might be constructed very much as shown in FIG. 4 with the modulation input 190 being connected to enable line 128. The input circuitry might also be modified so as to sense and encode modulation amplitude rather than instantaneous amplitude. Alternatively, modulation amplitude could be calculated using more complex control logic, such as a microprocessor.

A second laser 192 is positioned to transmit optical signals along the same optical fiber 194 as laser 162. Photosensors 196, 198 (which could be a single photosensor) sense the light amplitude of laser 192 and provide a feedback signal to controllers 200, 220, which correspond in function and operation to controllers 160, 180. Controllers 200, 220 provide bias current 212 and modulation current 228 for laser 192.

Digital System 240 controls all four digital controllers 160, 180, 200, 220 via digital control lines 242, 244, 246, 248 and receives digital status reports from the controllers via lines 252, 254, 256, 258. Data to be transmitted on optical fiber 194 is received by digital system 240 via line 260. Control signals are communicated to and from digital system 240 via line 262. In operation, only one of the lasers 162, 192 is used at one time. The other laser is held in reserve for the time when the first laser or an associated controller or sensor fails to function properly. Proper functioning of the operational laser is monitored by digital system 240. When there is not satisfactory operation of the one laser (failure or impending failure) or one of its controllers or sensors, digital system 240 automatically switches over from the improperly functioning laser system to the redundant laser system held in reserve for just such purpose. The switch over is reported along line 262 so that repair or replacement of the improperly functioning laser system can be scheduled.

It should be readily apparent that many modifications and variations can be made to my invention. For example, the two threshold comparator of FIG. 2 might have only one threshold (say the lower one) responding to substantially instantaneous power, rather than both thresholds, while the other threshold responds to average power. The thresholds obviously could then be closer together. With proper selection of thresholds, this might allow the laser advantageously to be operated at an average power level closer to $I_{TH}$. Obviously, both thresholds could also respond to average power. Furthermore, even a single threshold comparator could be used in combination with suitable following logic functions. These and other modifications and variations can be made without departing from the spirit and scope of my invention, which is defined by the following claims.

Having thus described my invention, what I claim as new and desire to secure by Letters Patent is:

1. A control circuit for a light emitting semiconductor device, comprising:
    a light emitting semiconductor device;
    means for sensing the light output from said light emitting semiconductor device;
    means responsive to said sensing means for producing a digital representation of an amplitude of the actual light output of said light emitting semiconductor device;
    control logic for generating a digital output signal representing a drive current for said light emitting semiconductor device; and
    means converting said digital output signal into drive current for said light emitting semiconductor device, said control logic comparing said digital representation of the actual amplitude of the light output with a digital representation of a desired amplitude for the light output and gradually changing said digital output signal so as to reduce the difference therebetween.

2. A control circuit as defined in claim 1 wherein said means for sensing the light output from the light emitting semiconductor device comprises a photodiode.

3. A control circuit as defined in claim 1 wherein said amplitude is substantially the instantaneous light amplitude of the light emitting semiconductor device.

4. A control circuit as defined in claim 1 wherein said amplitude is the average light amplitude of the light emitting semiconductor device.

5. A control circuit as defined in claim 1 wherein said amplitude is the modulation amplitude of the light emitting semiconductor device.

6. A control circuit as defined in claim 1 wherein said control logic comprises a microprocessor.

7. A control circuit as defined in claim 1 wherein said drive current is bias current for the light emitting semiconductor device.

8. A control circuit as defined in claim 1 wherein said drive current is modulation current for the light emitting semiconductor device.

9. A control circuit as defined in claim 1 and further comprising means for producing a second digital representation of another amplitude of the actual light output of said light emitting semiconductor device said amplitude and said another amplitude being different amplitude parameters; additional control logic for generating a second digital output signal representing an additional drive current for said light emitting semiconductor device; and second means for converting said second digital output signal into drive current for said light emitting semiconductor device, said additional control logic comparing said second digital representation of said another actual amplitude of the light output with a second digital representation of a desired another amplitude for the light output and gradually changing said second digital output signal so as to reduce the difference therebetween.

10. A control circuit as defined in claim 9 wherein said digital representation of an amplitude represents the bias current amplitude of the light emitting semiconductor device and said second digital representation of said another amplitude represents the modulation amplitude of the light emitting semiconductor device.

11. A control circuit as defined in claim 1 wherein said control logic comprises an up/down counter, said digital output signal being the count of said counter.

12. A control circuit as defined in claim 1 wherein said means for converting said digital output signal comprises a digital to analog converter.

13. A control circuit as defined in claim 12 wherein said digital to analog converter comprises a digitally programmable current source.

14. A control circuit as defined in claim 13 wherein said digitally programmable current source is of the resistor ladder network type.

15. A control circuit as defined in claim 1 wherein said means for producing a digital representation of the light output amplitude comprises an analog to digital converter.

16. A control circuit as defined in claim 15 wherein said analog to digital converter comprises a two threshold comparator.

17. A control circuit as defined in claim 16 wherein said two threshold comparator generates a first digital code when the sensed light output amplitude is within a range of amplitude values between first and second different threshold values, said comparator generating a second digital code when the sensed light output amplitude is below said range of amplitude values, and said comparator generating a third digital code when the sensed light output amplitude is above said range of amplitude values.

* * * * *